(12) United States Patent
Huang

(10) Patent No.: US 12,289,958 B2
(45) Date of Patent: Apr. 29, 2025

(54) DISPLAY PANEL AND METHOD OF MANUFACTURING THEREOF

(71) Applicant: SEEYA OPTRONICS CO., LTD., Shanghai (CN)

(72) Inventor: Zhongshou Huang, Shanghai (CN)

(73) Assignee: SEEYA OPTRONICS CO., LTD., Shanghai (CN)

(*) Notice: Subject to any disclaimer, the term of this patent is extended or adjusted under 35 U.S.C. 154(b) by 354 days.

(21) Appl. No.: 17/701,796

(22) Filed: Mar. 23, 2022

(65) Prior Publication Data

US 2023/0097246 A1 Mar. 30, 2023

(30) Foreign Application Priority Data

Sep. 30, 2021 (CN) .......................... 202111165271.9

(51) Int. Cl.
*H10K 59/121* (2023.01)
*H10K 59/12* (2023.01)

(52) U.S. Cl.
CPC ......... *H10K 59/1213* (2023.02); *H10K 59/12* (2023.02); *H10K 59/1216* (2023.02); *H10K 59/1201* (2023.02)

(58) Field of Classification Search
CPC ............... H10K 59/121; H10K 59/122; H10K 59/1213; H10K 59/123–125; H10K 59/131; H01L 27/1211; H01L 21/823431; H01L 21/823821; H01L 21/845; H01L 27/0886; H01L 27/0924; H01L 27/10826;
(Continued)

(56) References Cited

U.S. PATENT DOCUMENTS 6,992,439 B2 * 1/2006 Yamazaki .......... H10K 59/8723
313/506
7,508,034 B2 * 3/2009 Takafuji ............. H10D 30/6744
257/66
(Continued)

FOREIGN PATENT DOCUMENTS

CN 101794712 8/2010
CN 107359262 11/2017
(Continued)

OTHER PUBLICATIONS

First Examination Report Notification issued Dec. 31, 2024 for corresponding Chinese Application No. 202111165271.9.
(Continued)

*Primary Examiner* — Younes Boulghassoul
*Assistant Examiner* — Quinton A Brasfield
(74) *Attorney, Agent, or Firm* — Duane Morris LLP

(57) ABSTRACT

Provided is an OLED display panel fabricated on a hybrid substrate. The hybrid substrate includes a single-crystal silicon substrate and a silicon on insulator (SOI) substrate built on the single-crystal silicon substrate. The display panel includes an OLED pixel array and a row scanning circuit and a data input circuit. The OLED pixel includes SOI switching transistor and SOI driving transistor, fabricated on the SOI substrate. The row scanning circuit and the data input circuit are fabricated on the single crystal silicon substrate. This arrangement allows low voltage driving CMOS circuit and high voltage driving OLED pixels integrated together on one hybrid substrate.

9 Claims, 6 Drawing Sheets

(58) Field of Classification Search
CPC ......... H01L 27/10879; H01L 29/41791; H01L 29/66795–66818; H01L 29/785–7856; H01L 2029/7857–7858; H01L 2924/13067

See application file for complete search history.

(56) References Cited

U.S. PATENT DOCUMENTS

| | | | |
|---|---|---|---|
| 8,450,195 B2 | 5/2013 | Chen et al. | |
| 9,698,176 B1* | 7/2017 | Kumar | H01L 27/1251 |
| 11,362,164 B2 | 6/2022 | Richter et al. | |
| 11,744,109 B2 | 8/2023 | Yamazaki et al. | |
| 2001/0026125 A1* | 10/2001 | Yamazaki | H10K 59/131 |
| | | | 313/506 |
| 2018/0040640 A1* | 2/2018 | Takahashi | H10D 86/0212 |
| 2021/0175309 A1* | 6/2021 | Huang | H10K 59/1216 |
| 2022/0344428 A1* | 10/2022 | Wu | H10K 59/1201 |
| 2023/0093906 A1 | 3/2023 | Huang | |

FOREIGN PATENT DOCUMENTS

| | | |
|---|---|---|
| CN | 107393863 | 11/2017 |
| CN | 112689893 | 4/2021 |
| CN | 113889520 | 1/2022 |
| JP | H0675244 | 3/1994 |
| KR | 20040093948 | 11/2004 |

OTHER PUBLICATIONS

Lee, Su-Hawn et al., "The fabrication and characterization of organic light-emitting diodes using transparent single-crystal Si membranes", Nanotechnology 20 (2009) 455202 (8pp), doi:10.1088/0957-4484/20/45/455202.

* cited by examiner

DISPLAY PANEL AND METHOD OF MANUFACTURING THEREOF

CROSS-REFERENCE TO RELATED APPLICATION

This application claims priority to Chinese Patent Application No. 202111165271.9 filed Sep. 30, 2021, the disclosure of which is incorporated herein by reference in its entirety.

TECHNICAL FIELD

Embodiments of the present disclosure relate to display technology and, in particular, to a display panel and a method for manufacturing the display panel.

BACKGROUND

With the technology development and market applications of organic light-emitting diode (OLED) displays in augmented reality (AR) and virtual reality (VR) wearable displays, increasingly high performances are required for the display panels used in OLED micro-displays. In particular, an ultra-high resolution of 5000 ppi and approximately 5-micron pixel have become reality. It is anticipated that the size of a single pixel may approach 1 micron in the near future, and then all transistors in the pixel circuit must be at a sub-micron level.

FIG. 1 is a structure diagram of an OLED display fabricated on a silicon wafer, which is also referred to as a silicon-based OLED. Similar to a conventional complementary metal-oxide-semiconductor (CMOS) transistor, heavily doped diffusion regions 021 of a source and a drain are formed in the bulk and on the surface of a silicon substrate 010, and then source and drain metals 022 are formed, which are in ohmic contact with the source and drain diffusion regions 021 through vias on an oxide layer 031. A polysilicon gate 023 is fabricated on the oxide layer 031 to control the on/off state of the transistor. On the same silicon substrate, other components for each of pixels, such as a switching transistor for resetting potential, a transistor for compensating for a voltage deviation and a storage capacitor, are fabricated as well. In addition, scan lines, data lines and power lines for controlling the pixels are also fabricated on the silicon substrate through conventional techniques of a semiconductor integrated circuit. A pixel array, fabricated on the silicon substrate in the manner as described above, is generally referred to as a backplane of the display panel.

A passivation layer 032 followed by a relatively thick interlayer insulating film are formed on the backplane through evaporation or coating methods. The source of the driving transistor is then connected to an OLED anode metal layer 041 by a connector 024 through a via. Anode metals of the pixels are separated by a pixel defining layer (PDL) 033. The PDL 033 is used to reduce a lateral leakage current or an electrical breakdown between the anode metal and the cathode metal of the OLED caused by a strong fringe field at the edge of the anode metal.

Various function layers and a cathode metal layer 042 of the OLED are sequentially evaporated on the backplane with an array of anode metal pads and a grid of the PDL 033. For simplicity without losing generality, only the simplest three-layer OLED structure is illustrated in FIG. 1, which includes a hole injection and transport layer 043 in contact with the anode metal layer 041, an electron injection and transport layer 044 in contact with the cathode metal layer 042, and an OLED light-emitting layer 045 sandwiched therebetween. A planarization layer 034 is generally formed on the cathode metal layer 042 to reduce surface roughness caused by thickness discrepancy between the anode metals and the PDL 033, so color filter film can be uniformly coated on an even surface in a subsequent coating process. The color filter film includes filters in different colors, such as red filters 051, and a black film therebetween, where the black film is generally referred to as a black matrix (BM) and used for absorbing light to reduce color cross-talk.

As mentioned above, transistors in the sub-micron level are necessary to realize an ultra-high resolution display panel, so CMOS integrated circuit (IC) manufactured in an IC foundry needs to follow a scaling down rule. In such a case, as the size of the transistor on the substrate plane is reduced, geometric dimensions of the transistor in a depth direction should be reduced accordingly. For example, an ion implantation depth and an ion diffusion depth of a doped region and a thickness of a gate dielectric film should be reduced accordingly. Not only the geometric dimensions of the transistor, but also its driving voltage, should be scaled down. However, on the other side, a sufficiently high voltage is necessary for driving an OLED film, in order to generate sufficient current density in an organic film with low carrier mobility, and therefore to excite more photons. For example, 5V voltage is normally needed on the OLED film to realize sufficient brightness and grayscales of image. To further boost light output, some OLED panels have adopted a structure where two OLEDs are stacked up. As a consequence, bias voltage to appropriately drive the two series-connected OLEDs is doubled to 10V.

Such a high voltage inevitably causes various problems in a sub-micron CMOS transistor. In particular, the various problems include a lateral leakage current between the source and the drain of the transistor in a threshold or subthreshold regions, a vertical leakage current between the source/drain diffusion regions 021 and the silicon substrate, a gate leakage current through the oxide layer 031, drain-induced barrier lowering (DIBL) of the transistor due to a drain voltage, and various parasitic effects originated from the leakage current and electric field stress in the silicon substrate. Among these parasitic effects, latch-up effect most frequently occurs and is harmful to the CMOS IC. The latch-up effect means that a path of a parasitic leakage current with low impedance is developed between a power supply and a ground potential of the silicon substrate due to coupling of parasitic PNP and NPN bipolar junction transistors (BJTs). The higher the IC density is, the higher the latch-up occurring risk is. A large current not only increases power consumption but also burns the IC chip in an extreme case.

To solve the problem of the silicon-based OLED with a high resolution, eMagin (US20210183314A1) provides a structure and a method in which transistors driven at a high voltage and transistors driven at a low voltage are fabricated on two different substrates, respectively. The two different substrates are stacked up by connecting related electrode arrays using conductive connection, where the transistors in the two different substrates are fabricated with different technologies and with different scaling down rules. However, this method has a tremendous challenge in perfectly connecting tens of million electrode pads on the two substrates. Attempt of perfectly aligning and connecting the tens of million tiny electrode pads may easily fail by wafer expansion/contraction due to different thermal cycles and separate photolithography processes.

To avoid the above-described detrimental effects which occur in the bulk of silicon substrate, U.S. Pat. No. 8,975,832B2 provides an alternative approach, that to fabricate all transistors and related circuits in a thin film of crystalline silicon. The most mature technology in the approach is silicon on insulator (SOI), i.e., a thin film of silicon fabricated on an insulating substrate. The characteristics of an SOI transistor such as carrier mobility and defect density are approximately equal to or slightly inferior to that of the bulk silicon transistor, and far superior than that of a polysilicon film, an oxide semiconductor film or a hydrogenated amorphous silicon film. However, the SOI transistors have some drawbacks originated from a self-heating effect and a floating body effect. Like all thin-film transistors (TFTs), the SOI transistor is fabricated on the insulating substrate, its semiconductor channel layer is wrapped from upper and lower surfaces by thermally insulating films and therefore its thermal conductivity is approximately 1% of that of the bulk silicon transistor. In another words, heat generated by channel current has difficulty to dissipate. In case the SOI transistor is driven at a relatively high frequency and by a relatively large current density, a rapid temperature rise of the transistor may lead to performance degradation such as reduction of carrier mobility and accelerated aging of the OLED material. The floating body effect, on the other hand, will approximately double the susceptibility of the SOI transistor to ESD events, resulting in higher ESD damage risk. These detrimental effects become more harmful as the integration density of the transistors becomes higher. As a matter of fact, SOI transistors in deep sub-microns or tens of nanometers may not have a sufficiently high production yield in a wafer foundry and are lack of reliability in field operations.

Moreover, an OLED pixel array and its peripheral driving and signal processing circuitry can be integrated on one silicon chip. To achieve narrow border or even a border less display and low power consumption, CMOS transistors in tens of nanometers scale might be needed particularly in high resolution and miniaturized AR/VR display panels. Conflicts in driving voltage between the peripheral circuitry and OLED pixel array will become more and more severe.

SUMMARY

A display panel used in the embodiments of the present disclosure includes a hybrid semiconductor substrate overlaid with an OLED light-emitting layer. The hybrid substrate includes a first region and a second region. The first region includes a signal processing circuit and a control circuit fabricated directly in a single-crystal silicon substrate, and the second region includes an SOI substrate built directly on the single-crystal silicon substrate. The SOI substrate includes a buried silicon oxide layer and a single-crystal silicon film. A pixel array is fabricated in the SOI substrate. The OLED light-emitting layer is formed on the pixel array and controlled by the pixel array.

Another embodiment of the present disclosure provides a method for manufacturing a display panel described above. The method includes: providing a single-crystal silicon substrate to form a first region and a second region; forming an SOI substrate on the single-crystal silicon substrate in the second region through ion implantation and heat treatment while covering the first region with a mask, where in the second region the SOI substrate includes a buried silicon oxide layer in the bulk of the single-crystal silicon substrate and a single-crystal silicon film on the buried silicon oxide layer; forming a signal processing circuit and a control circuit of the display panel directly on the single-crystal silicon substrate in the first region, and forming a pixel array including thin-film transistors on the SOI substrate in the second region.

Another embodiment of the present disclosure further provides a display apparatus including the preceding display panel which includes a hybrid semiconductor substrate overlaid with an OLED light-emitting layer. The hybrid substrate includes a first region and a second region. The first region includes a signal processing circuit and a control circuit fabricated directly in a single-crystal silicon substrate, and the second region includes an SOI substrate built directly on the single-crystal silicon substrate. The SOI substrate includes a buried silicon oxide layer and a single-crystal silicon film. A pixel array is fabricated in the SOI substrate. The OLED light-emitting layer is formed on the pixel array and controlled by the pixel array.

DETAILED DESCRIPTION

Figure 1:
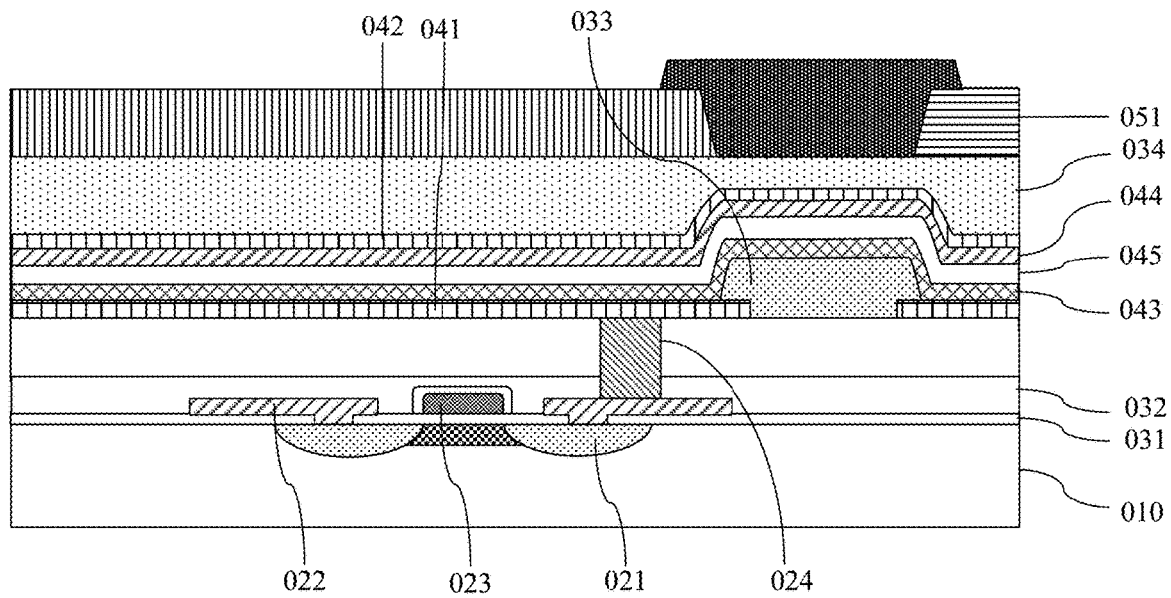
FIG. 1 is a sectional view of a display panel in the related art.

The present disclosure is further described hereinafter in detail in conjunction with drawings and embodiments. It is to be understood that the embodiments are intended to illustrate and not to limit the present disclosure. Additionally, for ease of description, the structures shown in the drawings may be part or all.

Terms, such as "on", "under", "in", "left" and "right" in the embodiments, are described from the point of view in the drawings and are not to be construed as limiting the embodiments. Additionally, in the context, it is to be understood that when an element is formed "on" another element, the element can not only be directly formed "on" the other element but also be indirectly formed "on" the other element through an intermediate element. Terms, such as "first" and "second", are used only for the purpose of description to distinguish between different components and not to indicate any order, quantity or importance. For those of ordinary skill in the art, specific meanings of the preceding terms in the present disclosure may be understood based on specific situations.

Figure 2:
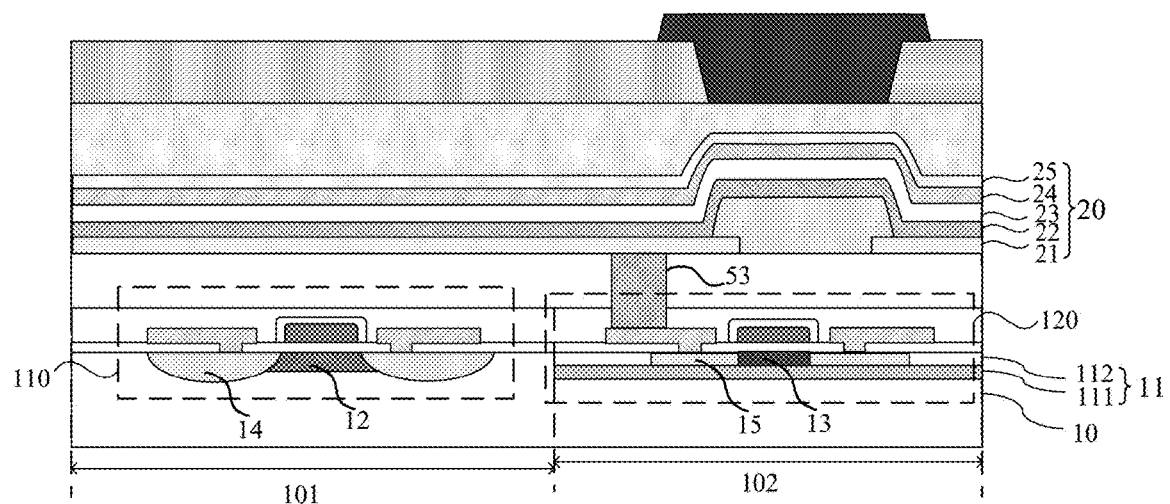
FIG. 2 is a sectional view of a display panel according to an embodiment of the present disclosure.

FIG. 2 is a sectional view of a part of a display panel according to an embodiment of the present disclosure. The display panel 1 includes a hybrid semiconductor substrate overlaid with an OLED light-emitting layer. The hybrid substrate includes a first region 101 and a second region 102. The first region 101 includes transistors 110 fabricated directly in a single-crystal silicon substrate 10, such as transistors for a signal processing circuit and a control circuit. The second region 102 includes an SOI substrate 11 built directly on the single-crystal silicon substrate 10, and the SOI substrate 11 includes a buried silicon oxide layer 111 and a single-crystal silicon film 112. A pixel array is fabricated in the SOI substrate 11, and the pixel array includes multiple pixel circuits each of which includes a driving transistor 120. The display panel 1 includes an OLED 20 which is formed on the pixel array and is controlled by the pixel array. The driving transistor 120 in each pixel provides a voltage to the OLED 20.

In the embodiment, the transistors 110 may be directly formed on the single-crystal silicon substrate 10 in the first region 101 through a process such as doping, and these transistors 110 may be part of the signal processing circuit and the control circuit. Specific structures that are not described in detail here, such as those of the signal processing circuit and the control circuit, are the same as those in FIG. 1 and the details are not repeated here. In the second region 102, the buried silicon oxide layer 111 followed by the single-crystal silicon film 112 are formed on the single-crystal silicon substrate 10 through ion implantation with high-energy oxygen to fabricate the SOI substrate 11. The pixel array including the driving transistors 120 is formed on the SOI substrate 11.

As shown in FIG. 2, the OLED 20 is formed on the pixel array and includes an anode metal 21, a hole injection layer 22, a light-emitting layer 23, an electron injection layer 24 and a cathode metal 25. Provided holes and electrons are injected into the light-emitting layer 23 through the hole injection layer 22 and the electron injection layer 24, respectively; and the light-emitting layer 23 will emit light through recombination of the holes and electrons. The OLED 20 needs to be driven by a voltage provided by the driving transistor 120 in each pixel of the pixel array. Since the pixel array including the driving transistors 120 is formed on the SOI substrate 11 and the anode metal 21 of the OLED 20 is connected to the source or drain of the corresponding driving transistor 120 on the SOI substrate just through a connector 53, the pixel array can provide an adequate driving voltage to the OLED 20, to ensure high light output from the OLED 20 and high performance of the display panel 1.

In the embodiment, circuitry of the display panel 1 includes at least one signal processing circuit and at least one control circuit which are made in the single-crystal silicon substrate 10 in the first region 101, and the pixel array made in the SOI substrate 11 in the second region 102. To obtain high light output from the light-emitting layer 23, the OLED 20 needs to be driven in a relatively high voltage, for example, 5 V or even 10 V. The pixel array made in the SOI substrate 11 is capable of providing an adequate bias voltage without causing various parasitic effects such as excessive lateral leakage current and high electric field stress in the bulk of the silicon substrate. At the same time, the structure of the hybrid substrate can ensure that the switching transistors 110 used in the signal processing circuit and the control circuit are driven by relatively low voltage. Therefore, the switching transistors 110 in the first region 101 and the driving transistors 120 in the second region 102 are operated in a low voltage and a high voltage, respectively, satisfying the different requirements of driving a CMOS integrated circuit at a low voltage and driving the OLED at a high voltage.

Figure 3:
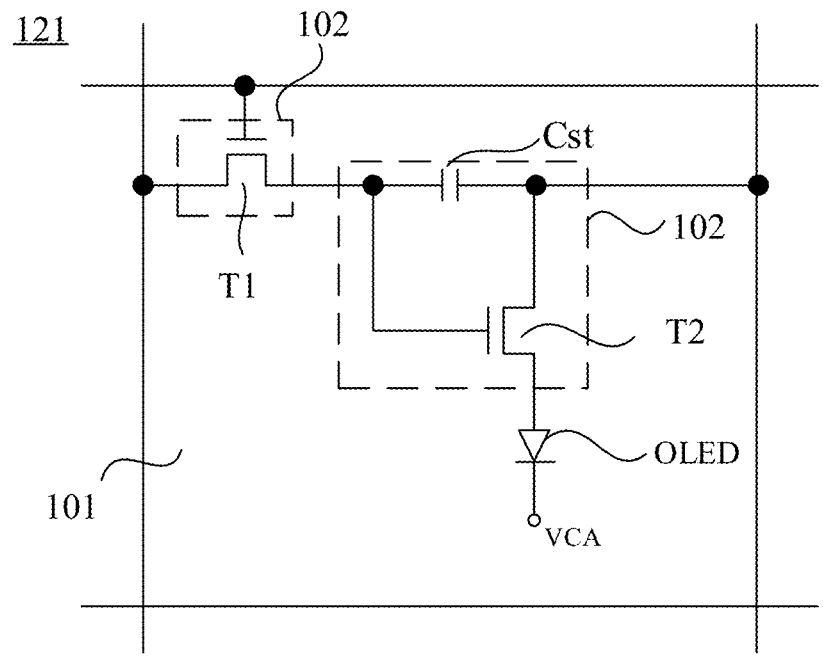
FIG. 3 is a schematic diagram of an equivalent pixel circuit according to an embodiment of the present disclosure.

FIG. 3 is a schematic diagram of an equivalent pixel circuit according to an embodiment of the present disclosure. The pixel array hereinafter is formed by multiple pixel circuits 121, arranged orthogonally in rows and columns (not shown in the figure) in a display region of the display panel. Each of the multiple pixel circuits 121 includes at least an SOI switching transistor T1, an SOI driving transistor T2, a storage capacitor Cst and an electrode pad shared with the OLED anode.

In an embodiment, a signal voltage is written to the storage capacitor Cst through the SOI switching transistor T1. In an embodiment, the SOI switching transistor T1 and/or the storage capacitor Cst may be located in the first region 101 or in the second region 102.

Figure 4:
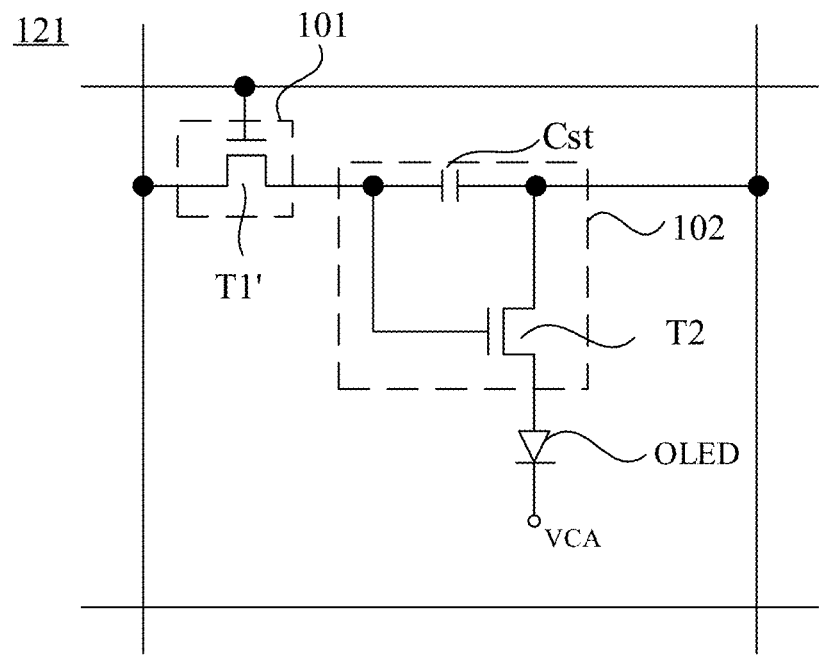
FIG. 4 is a schematic diagram of another equivalent pixel circuit according to an embodiment of the present disclosure.

The pixel circuit shown in FIG. 3 is the basic 2T1C circuit. In another embodiment, the pixel circuit may be a 7T1C circuit or a circuit including a different number of transistors and a different number of capacitors. As an example, each pixel circuit 121 may include a switching transistor T1' located in the first region 101. As shown in FIG. 4, the switching transistor T1' is located in the first region 101, and the SOI driving transistor T2 and the storage capacitor Cst are located in the second region 102. In another example, both the switching transistor T1' and the storage capacitor Cst are located in the first region 101, and the SOI driving transistor T2 is located in the second region 102.

The anode metal 21 is located in the second region 102, and the cathode metal 25 is connected to an external voltage supply VCA. A voltage drop from the VCA to the source terminal of the SOI driving transistor T2 equals to the bias voltage across the OLED 20. The SOI driving transistor T2 made in the SOI substrate 11 in the second region 102 must be able to bear a voltage close to the voltage drop across the OLED, so as to ensure large dynamic range of the OLED.

Figure 5:
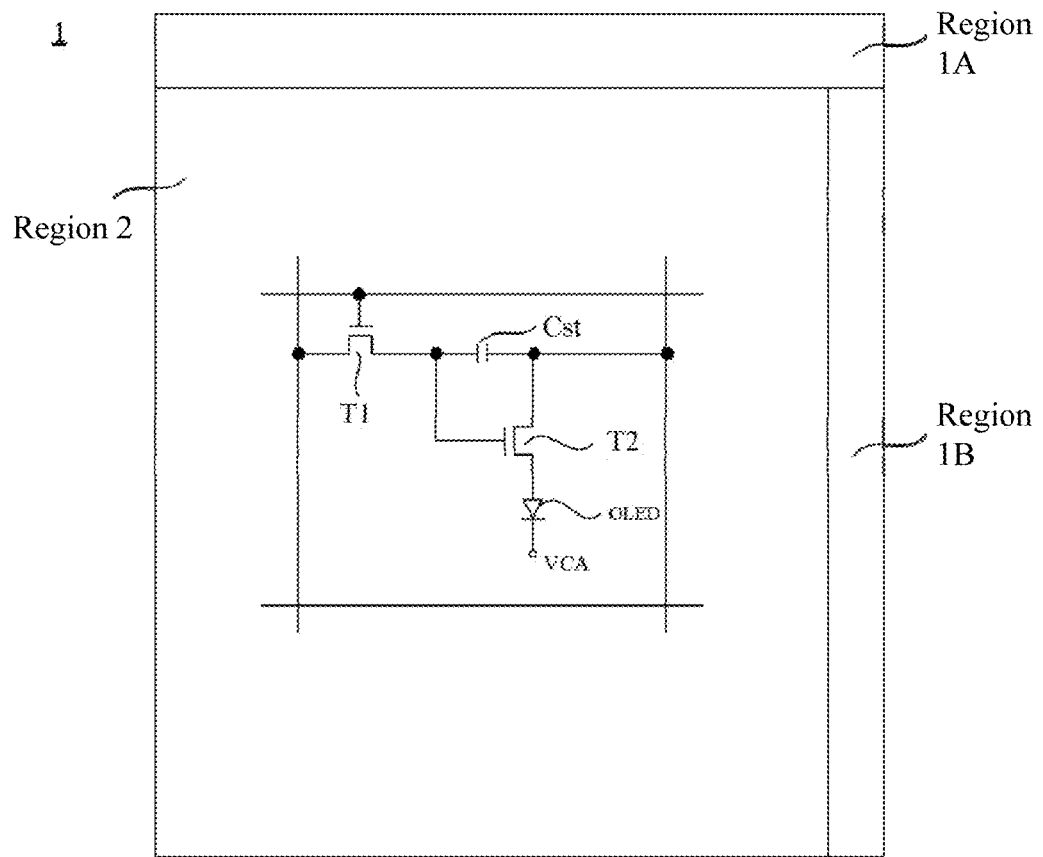
FIG. 5 is a block diagram of an OLED display panel according to an embodiment of the present disclosure.

The first region and the second region can be applied not only for one pixel as described above, but also for the entire silicon substrate. In an embodiment, as shown in FIG. 5, the backplane includes a region 1A, a region 1B and a region 2. The region 2 acts as the second region 102 which is dedicated for a display region comprising the array of the pixel circuits (only one pixel circuit is shown as an example in the figure). The region 1A is dedicated for circuits of signal input and processing, and the region 1B is dedicated for a scan circuit module, wherein both region 1A and region 1B are part of the first region 101. With this arrangement, a highly integrated circuit can be achieved in the regions 1A and 1B, and the low leakage current and less parasitic capacitance can be realized in the region 2.

Figure 6:
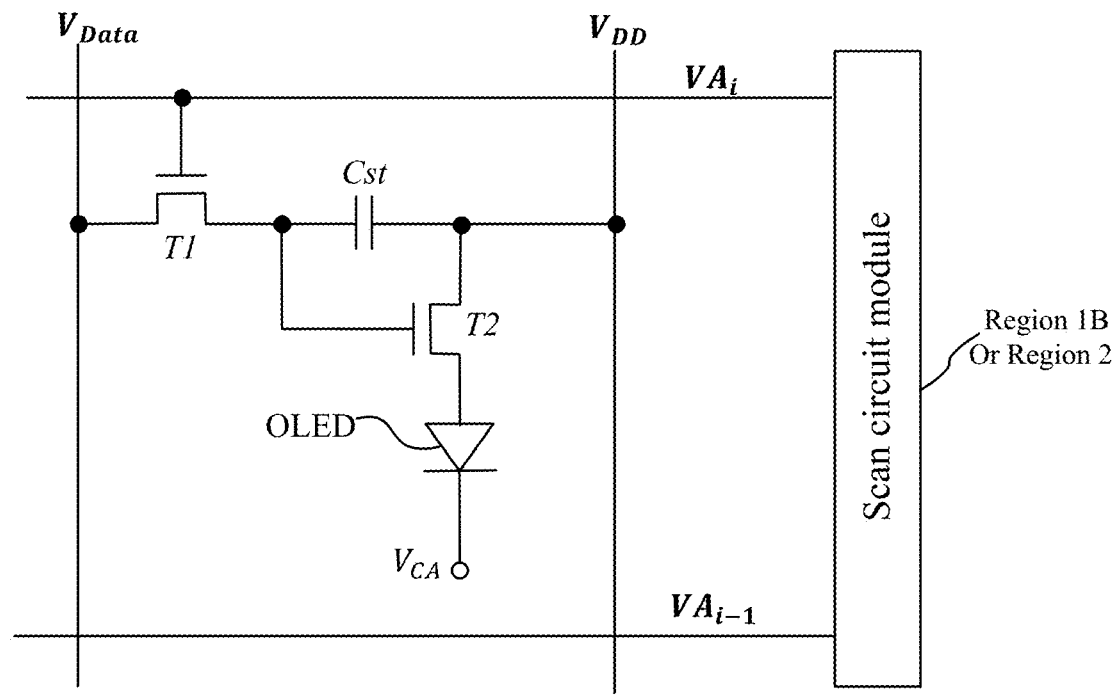
FIG. 6 is a schematic diagram illustrating collections between an OLED pixel and the scan circuit module according to an embodiment of the present disclosure.

FIG. 6 is a schematic diagram illustrating collections between an OLED pixel and the scan circuit module according to an embodiment of the present disclosure. In FIG. 6, the scan lines are connected to the scan circuit module on one side of the pixel array. Referring to FIG. 5, the scan circuit module can be built-in the region 1B which is part of the first region 101 or part of the second region 102 on the hybrid substrate. The scan circuit module supplies row scanning control pulse VA to row scan lines to sequentially turn on or turn off the pixel switches on each scan row. As shown in FIG. 5, the scan circuit module is located on the right side of the pixel array for progressive scanning. Alternatively, the scan circuit module can be located on both left and right sides for interdigital scanning, and the both left and right sides can be part of the first region 101 or the second region 102.

Figure 7:
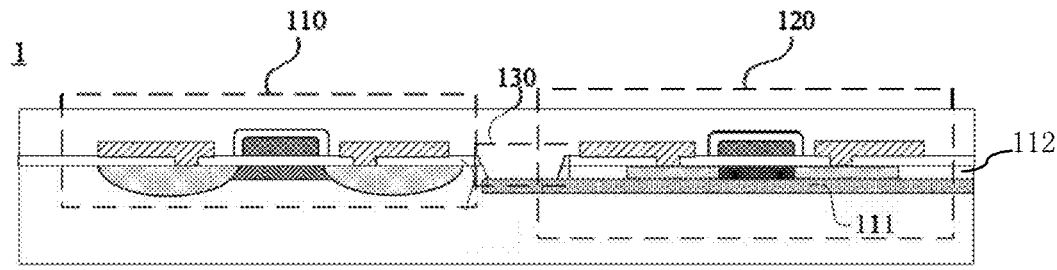
FIG. 7 is a sectional view of a display panel according to an embodiment of the present disclosure.
Figure 8:
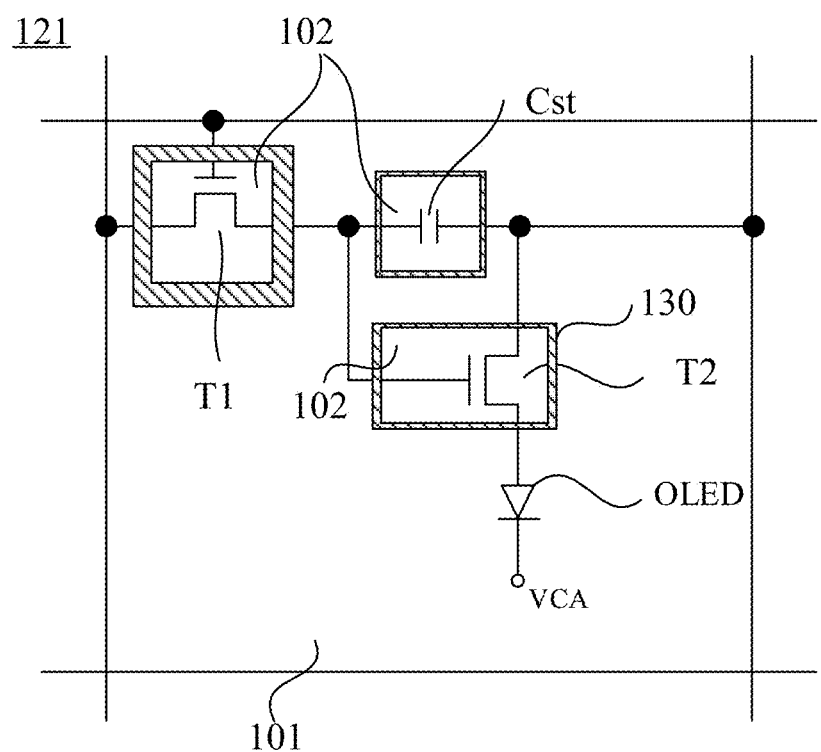
FIG. 8 is a schematic diagram of another equivalent pixel circuit according to an embodiment of the present disclosure.
Figure 9:
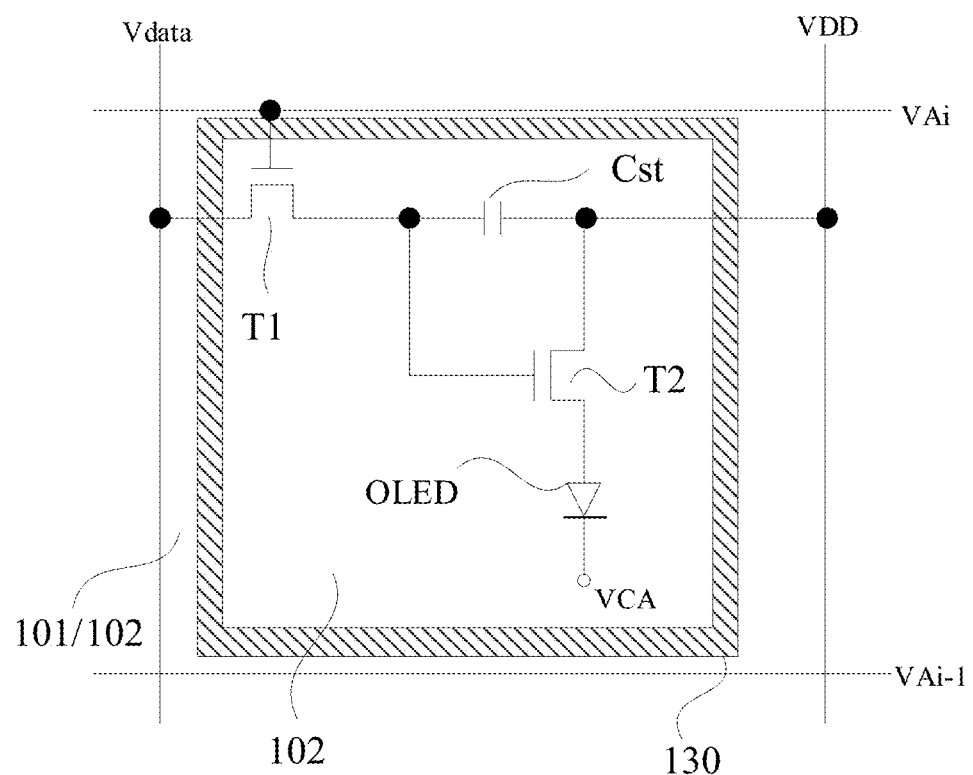
FIG. 9 is a schematic diagram of another equivalent pixel circuit according to an embodiment of the present disclosure.

FIG. 7 is a sectional view of a display panel according to an embodiment of the present disclosure. FIG. 8 and FIG. 9 are schematic diagrams of other equivalent pixel circuits according to embodiments of the present disclosure, respectively. As shown in FIG. 7, the display panel 1 further includes a separation zone 130 surrounding at least the driving transistor 120 in each pixel, and the separation zone 130 is formed by removing the single-crystal silicon film 112. In an example of manufacture process, after completing fabrication of the hybrid semiconductor substrate, along the border of the SOI region and on the buried silicon oxide layer 111, the gate oxide layer and the single-crystal silicon film 112 are removed by dry plasma etching, and the buried silicon oxide layer 111 is exposed. After this etching process step, a passivation layer is coated on the opening of the separation zone 130 to disconnect any lateral leakage path of leakage current. The width of the separation zone 130 can be in a range of tens to hundreds nanometers, and of course, which is subject to a manufacturing process and requirements of the display panel.

The separation zone 130 isolates the transistors 110 on the single-crystal silicon substrate from the driving transistors 120 on the SOI substrate by removing the single-crystal silicon film 112, and hence the crosstalk and parasitic effects between the transistors 110 and transistors 120 are minimized. This arrangement will improve operational reliability of the display panel.

The separation zone 130 may be located in different positions as needed. As shown in FIG. 8, the SOI switching transistor T1, the SOI driving transistor T2 and the storage capacitor Cst in each pixel circuit are located in the second region 102, and are surrounded by the separation zones 130 respectively. Since they are electronically isolated from each other, any crosstalk and parasitic effects among them can be avoided.

The separation zone 130 may also surround each pixel circuit. As shown in FIG. 9, a ring-shape separation zone 130 guards the entire pixel circuit, which is fabricated on the SOI substrate in the second region 102.

Also in FIG. 9, the power line VDD, the data line Vdata and the scan line VAi cross the ring-shape separation zone 130 and connect to the pixel. These bus lines themselves can be located in the second region 102 or the first region 101.

In an embodiment, each of the SOI switching transistor T1 and the SOI driving transistor T2 has a channel length less than 0.5 micron meter. In addition, the semiconductor in the channel regions of the SOI switching transistor T1 and the SOI driving transistor T2, as indicated in FIG. 2 the channel regions 12 and 13, are both lightly doped for threshold voltage adjustment. A reduction in the threshold voltage and therefore reduction of the gate voltage will lead to lower power consumption. In an embodiment, the gate of the SOI switching transistor T1 and the gate of the SOI driving transistor T2 may be manufactured simultaneously.

Referring to FIG. 2, both the bulk silicon transistor 110 fabricated in the first region 101 and the SOI transistor 120 fabricated in the second region 102 have a polysilicon gate, which may be manufactured simultaneously or separately. Alternatively, the gate of these transistors 110 and 120 may be made of different conductive materials such as an alloy of metal (i.e., copper), and so on. Polysilicon is preferred for the gate material because the polysilicon gate can be conformally passivated through oxidation of the polysilicon film, while an additional film evaporation is required for metal gate.

As each pixel size decreases to several micron meters or even approximately one micron meter, the geometric dimension of the SOI transistors in each pixel may be in deep sub-micron meter. Now consider a 1 μm×1 μm pixel built in the second region, where half of the pixel area is used for fabricating a pixel circuit including an SOI transistor for driving the OLED with 0.5 μm channel length and 0.2 μm channel width. Assuming that the electron mobility of the SOI transistor is approximately 300 $cm^2/cm\cdot s$, near one third of the bulk silicon electron mobility, and a 50 nm gate dielectric film, a 3 V gate to source voltage, and a 0.5 V FET threshold voltage, then a saturation current of the SOI transistor can easily reach 0.8 mA. For an OLED with 1000 $mA/cm^2$ current density, the current of the OLED inside of the 1 μm×1 μm pixel with an area of 1 μm×1 μm is merely 10 nA, which is far less than the saturation current of the SOI transistor.

Highly integrated CMOS circuits, which is built in the single crystal substrate, have the advantages of high speed, low power consumption and less heat dissipation issues. On the other hand, the pixel array, which is built in the SOI substrate, is capable of providing relatively high voltage for the OLED to obtain a large dynamic range and high brightness. In addition, the pixel array built in the SOI substrate can avoid high voltage related problems such as the latch-up effect and the leakage current. Therefore, this arrangement allows low voltage driven CMOS circuit and high voltage driven OLED pixels integrated together on one hybrid substrate.

Figure 10:
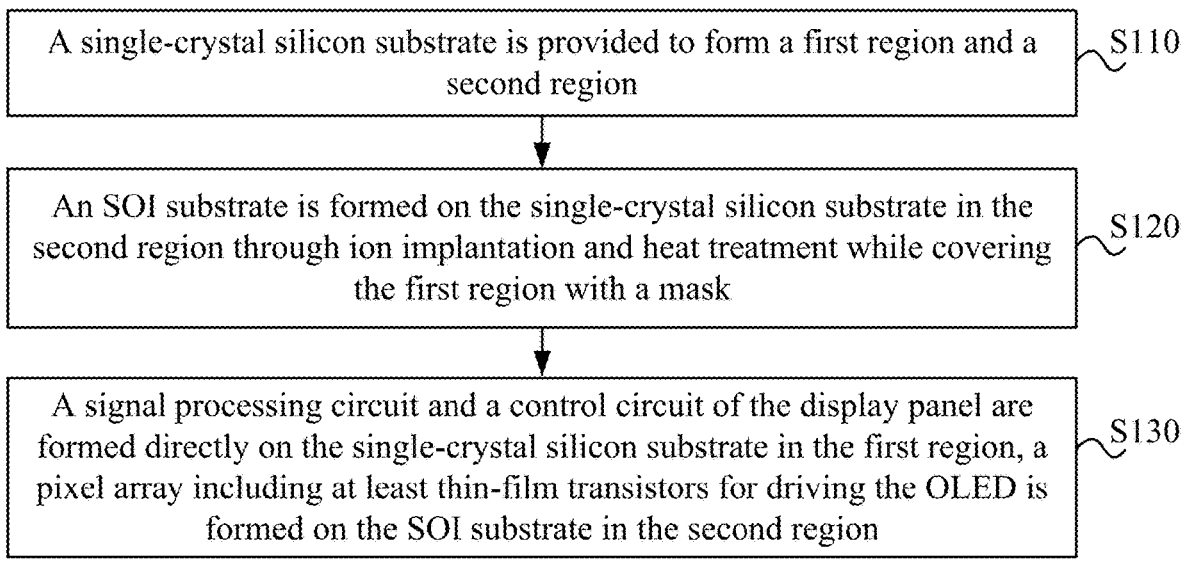
FIG. 10 is a flowchart of a method for preparing a display panel according to an embodiment of the present disclosure.

FIG. 10 is a flowchart of a method for preparing a display panel according to an embodiment of the present disclosure, which is used for preparing the display panel in the preceding embodiments. As shown in FIG. 10, the method includes the following steps.

In S110, a single-crystal silicon substrate is provided to form a first region and a second region.

In S120, an SOI substrate is formed on the single-crystal silicon substrate in the second region through ion implantation and heat treatment while covering the first region with a mask. The SOI substrate in the second region includes a buried silicon oxide layer in the bulk of the single-crystal silicon substrate and a single-crystal silicon film on the buried silicon oxide layer. Accordingly, a hybrid substrate, which includes the single-crystal silicon substrate in the first region and the SOI substrate in the second region, is formed.

The SOI substrate is made in the second region as follows: 1) the first region is shielded by a patterned photoresist or a mechanical mask with one or more through holes since the SOI substrate does not need to be formed in the entire first region; 2) ion implantation with high-energy oxygen is conducted in the second region to form an oxygen rich layer; and 3) removing the mask and cleaning the substrate, followed by a high temperature annealing to form a buried silicon oxide layer.

In S130, a signal processing circuit and a control circuit of the display panel are formed directly on the single-crystal silicon substrate in the first region, a pixel array including at least thin-film transistors for driving the OLED is formed on the SOI substrate in the second region.

An embodiment of the present disclosure further provides a display apparatus including any display panel provided in the preceding embodiments. The display panel includes a hybrid semiconductor substrate overlaid with an OLED light-emitting layer. The hybrid substrate includes a first region and a second region. The first region includes a signal processing circuit and a control circuit fabricated directly in a single-crystal silicon substrate, and the second region includes an SOI substrate built directly on the single-crystal silicon substrate. The SOI substrate includes a buried silicon oxide layer and a single-crystal silicon film. A pixel array is fabricated in the SOI substrate. The OLED light-emitting layer is formed on the pixel array and controlled by the pixel array. The display apparatus may be used for an AR or VR wearable display.

The preceding descriptions are only exemplary embodiments of the present disclosure, which is therefore not limited to the exemplary embodiments. Those skilled in the art can make various apparent modifications, adaptations, combinations and substitutions without departing from the scope of the present disclosure, which is determined by the following claims.

What is claimed is:

1. A display panel, comprising a hybrid substrate overlaid with an organic light-emitting diode (OLED);
   wherein the hybrid substrate comprises a first region and a second region, the first region comprises a signal processing circuit and a control circuit fabricated in a single-crystal silicon substrate, and the second region comprises a pixel array including a plurality of pixel circuits and fabricated in a silicon on insulator (SOI) substrate and wherein the SOI substrate is built directly on the single-crystal silicon substrate with a buried silicon oxide layer and a single-crystal silicon film, and the OLED is formed on the pixel array and controlled by the pixel array, wherein the first region is surrounding the second region.

2. The display panel of claim 1, wherein the plurality of pixel circuits arranged orthogonally in rows and columns and wherein the pixel circuit comprises at least an SOI switching transistor, a storage capacitor, and an SOI driving transistor which connects an anode of the OLED.

3. The display panel of claim 2, wherein the SOI switching transistor, the SOI driving transistor and the storage capacitor are surrounded by a separation zone; the separation zone is formed by removing the single-crystal silicon film.

4. The display panel of claim 2, wherein each of the plurality of the pixel circuits is surrounded by a separation zone; the separation zone is formed by removing the single-crystal silicon film.

5. The display panel of claim 1, further comprising: a scan circuit module which is located in the first region and on one side or two sides of the pixel array.

6. The display panel of claim 1, further comprising: a scan circuit module which is located in the second region and on one side or two sides of the pixel array.

7. The display panel of claim 2, wherein the SOI switching transistor and the SOI driving transistor each have a channel length less than 0.5 micron meter.

8. The display panel of claim 1, wherein the signal processing circuit and the control circuit each comprise a single-crystal silicon transistor with a polysilicon gate, and wherein the pixel circuit comprises an SOI transistor with a polysilicon gate, that these polysilicon gates are manufactured simultaneously.

9. A method for manufacturing a display panel, comprising:
   providing a single-crystal silicon substrate to form a first region and a second region;
   forming a silicon on insulator (SOI) substrate in the second region through ion implantation and heat treatment while covering the first region with a mask, wherein the SOI substrate comprises a buried silicon oxide layer in a bulk of the single-crystal silicon substrate and a single-crystal silicon film on the buried silicon oxide layer; and
   forming a signal processing circuit and a control circuit of the display panel directly in the first region, and forming a pixel array comprising thin-film transistors in the SOI substrate;
   wherein the first region is arranged by surrounding the second region.

* * * * *